US008446075B2

(12) United States Patent
Takahashi et al.

(10) Patent No.: US 8,446,075 B2
(45) Date of Patent: May 21, 2013

(54) CONDUCTIVE FILM, AND TRANSDUCER AND FLEXIBLE WIRING BOARD USING THE SAME

(75) Inventors: Wataru Takahashi, Aichi-ken (JP); Hitoshi Yoshikawa, Komaki (JP); Jun Kobayashi, Komaki (JP)

(73) Assignee: Tokai Rubber Industries, Ltd., Aichi-Ken (JP)

( * ) Notice: Subject to any disclaimer, the term of this patent is extended or adjusted under 35 U.S.C. 154(b) by 0 days.

(21) Appl. No.: 13/359,037

(22) Filed: Jan. 26, 2012

(65) Prior Publication Data

US 2012/0119626 A1 May 17, 2012

Related U.S. Application Data

(63) Continuation of application No. PCT/JP2011/059184, filed on Apr. 13, 2011.

(30) Foreign Application Priority Data

May 19, 2010 (JP) ................................. 2010-115015

(51) Int. Cl.
*H01L 41/047* (2006.01)

(52) U.S. Cl.
USPC ........... 310/364; 310/328; 310/338; 310/366; 310/800

(58) Field of Classification Search
USPC ........................... 310/328, 338, 364, 366, 800
See application file for complete search history.

(56) References Cited

U.S. PATENT DOCUMENTS

| 5,344,593 | A | 9/1994 | Chiba et al. |
| 2004/0018375 | A1 | 1/2004 | Banno et al. |
| 2008/0015284 | A1 | 1/2008 | Cakmak et al. |
| 2009/0015270 | A1 | 1/2009 | Hayakawa et al. |
| 2011/0018424 | A1* | 1/2011 | Takada ........................ 313/352 |
| 2011/0274968 | A1* | 11/2011 | Harrison et al. .............. 429/188 |
| 2011/0300393 | A1 | 12/2011 | Iio et al. |
| 2011/0308019 | A1 | 12/2011 | Terawaki et al. |

FOREIGN PATENT DOCUMENTS

| JP | 05-156166 | * | 6/1993 |
| JP | 5-156166 | | 6/1993 |
| JP | 11-66956 | | 3/1999 |
| JP | 2004-039989 | * | 2/2004 |
| JP | 2004-39989 | | 2/2004 |

(Continued)

OTHER PUBLICATIONS

"International Search Report (ISR).", Application No. PCT/JP2011/059184, Date: Jul. 26, 2011, pp. 1-2.

*Primary Examiner* — Thomas Dougherty
(74) *Attorney, Agent, or Firm* — Greenblum & Bernstein, P.L.C.

(57) ABSTRACT

To provide a conductive film that is flexible, extendable and contractible, and for which the electrical resistance hardly increases even when the conductive film is extended. The conductive film contains an elastomer and metallic filler particles, and satisfies a condition (A) [an average value of reference numbers is 0.8 (1/μm) or more, or the metallic filler particles include flake-like metallic filler particles having a thickness of 1 μm or less and an aspect ratio of 26 or more and the average value of the reference numbers is 0.4 (1/μm) or more] and a condition (B) [a number of unit areas for which an area percentage of the elastomer is 60% or more is 20 or more], the condition (A) being a conductivity indicator and the condition (B) being a flexibility indicator.

11 Claims, 10 Drawing Sheets

FOREIGN PATENT DOCUMENTS

| | | |
|---|---|---|
| JP | 2005-166322 | 6/2005 |
| JP | 2006-335976 | 12/2006 |
| JP | 2009-20006 | 1/2009 |
| JP | 2009-124839 | 6/2009 |
| JP | 2010-153364 | 7/2010 |
| JP | 2010-223953 | 10/2010 |
| WO | 2005/012411 | 2/2005 |

* cited by examiner

Voltage OFF

Voltage ON

Fig. 7(a) During extension
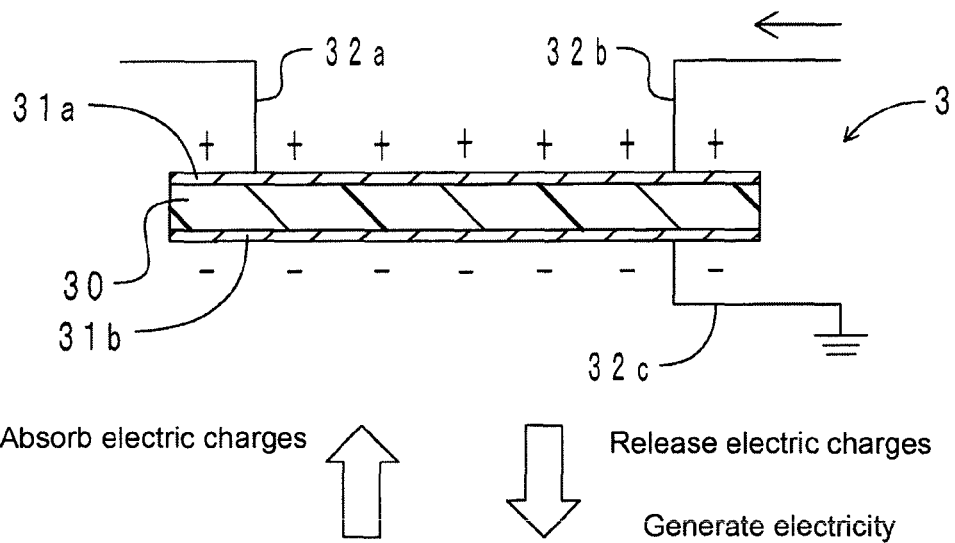
Absorb electric charges      Release electric charges
Generate electricity
Fig. 7(b) During contraction
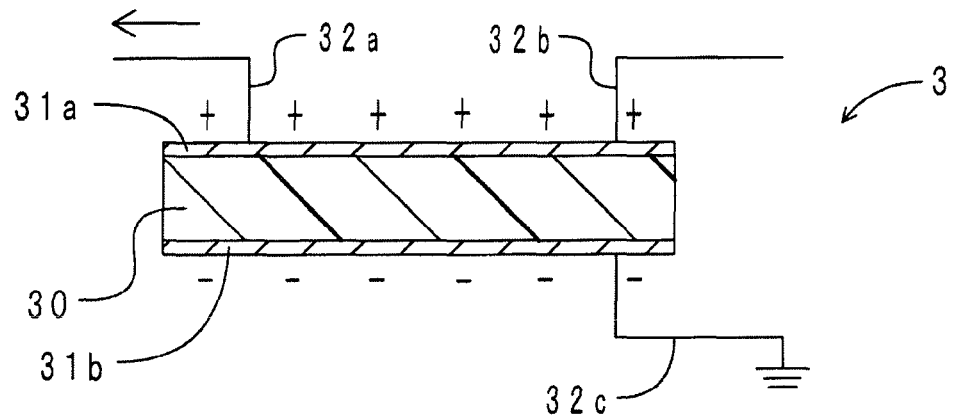

US 8,446,075 B2

CONDUCTIVE FILM, AND TRANSDUCER AND FLEXIBLE WIRING BOARD USING THE SAME

CLAIM FOR PRIORITY

This application is a continuation of PCT/JP2011/059184 filed Apr. 13, 2011, and claims the priority benefit of Japanese Application No. 2010-115015, filed May 19, 2010, the contents of which is expressly incorporated by reference in its entirety.

TECHNICAL FIELD

The present invention relates to an extendable and contractible conductive film that is suitable for an electrode, wiring, and the like, and to a transducer and a flexible wiring board using the conductive film.

TECHNICAL BACKGROUND

For example, as a means of detecting deformation and load distribution, a flexible sensor using an elastomer has been developed. An actuator using an elastomer is highly flexible and can be easily made lightweight and compact, and thus its use in various fields, such as artificial muscle, medical equipment, fluid control, and the like, has been studied. For example, an actuator can be configured by arranging electrodes on both sides in a thickness direction of a dielectric film made of an elastomer. In an actuator of this kind, the dielectric film extends and contracts according to the magnitude of an applied voltage. Therefore, it is required that an electrode be extendable and contractible according to the deformation of the dielectric film so as to avoid interfering with the extension and contraction of the dielectric film. In addition, it is also required that a change in electrical resistance be small when the electrode is extended.

From such a point of view, for example, according to Patent Document 1, an electrode is formed from a paste in which an oil and an elastomer are mixed with a conductive agent such as carbon black and the like. As a conductive material capable of being formed into a thin film, Patent Document 2 discloses a paste in which flake-like silver particles and spherical silver particles are dispersed in a synthetic resin and an organic solvent. Patent Document 3 discloses a paste in which copper particles, a thermoplastic acrylic resin, a titanate coupling agent and an organic solvent are mixed. Patent Document 4 discloses a paste in which at least one kind of a binder selected from a synthetic rubber, a silicone resin and a thermoplastic polyester resin, and two kinds of scale-like silver powders having different average particle sizes, are mixed.

RELATED ART

Patent Documents

Patent Document 1: Japanese Patent Laid-Open Publication No. 2009-124839

Patent Document 2: Japanese Patent Laid-Open Publication No. H11-66956

Patent Document 3: Japanese Patent Laid-Open Publication No. 2006-335976

Patent Document 4: Japanese Patent Laid-Open Publication No. 2005-166322

SUMMARY OF THE INVENTION

Problems to be Solved by the Invention

For example, in a case where carbon black is filled in an elastomer, even when the carbon black is highly filled, resistivity of the elastomer is relatively high at about 0.1-1 Ωcm. Therefore, there is a problem that, when an electrode or a wiring is formed from a paste in which a binder such as an elastomer or the like is mixed with carbon black, electrical resistance becomes large. When the electrical resistance of the electrode or the wiring is high, the device is likely to deteriorate due to heat generated by internal resistance. In addition, when the electrical resistance of the electrode or the wiring is high, responsiveness of the actuator may deteriorate due to the occurrence of a reactance component in a high frequency region. Further, when the internal resistance is too high with respect to a detection signal, resolution of the sensor may deteriorate.

On the other hand, an electrode formed from a commercially available silver paste lacks flexibility. The silver paste is formed by filling silver powder in a binder resin. In addition to having a high elastic modulus, the binder is highly filled with the silver powder. Therefore, the elastic modulus of the formed electrode becomes high. Thus, when the electrode is greatly extended, cracks occur and the electrical resistance significantly increases. In the case where an electrode of an actuator is formed from the silver paste, the electrode cannot follow extension and contraction of the dielectric film and may inhibit movement of the dielectric film.

In the pastes disclosed in the Patent Documents 2 and 3, the elastic modulus of the binder resin is high. Therefore, these pastes also are not suitable material for forming flexible electrodes and wirings of the above-described actuator and the like. According to the paste disclosed in the Patent Document 4, in order to achieve a desired conductivity, it is necessary to fill a relatively large amount of silver powder. Therefore, the elastic modulus of a formed electrode becomes high, and the electrode is unlikely to follow extension and contraction of the dielectric film. In addition, cracks are likely to occur when the electrode is extended, which causes electrical resistance to increase.

The present invention is devised in view of such circumstances, and a purpose of the present invention is to provide a conductive film that is flexible, extendable and contractible, and for which the electrical resistance hardly increases even when the conductive film is extended. Further, another purpose of the present invention is to provide a flexible transducer and a flexible wiring board by using such a conductive film.

Means for Solving the Problems (1) To achieve the above purposes, a conductive film of the present invention contains an elastomer and metallic filler particles filled in the elastomer, and satisfies the following conditions (A) and (B): (A) In a case where three straight lines extending in a film thickness direction are drawn on a film-thickness-direction cross-section photograph taken by using a scanning electron microscope with spacings of 3 μm each between the three straight lines in a film expansion direction; where, with respect to each of the straight lines, a count is made of the number of metallic filler particles that intersect the straight line and that each have a longest portion in the cross-section photograph with a length of 2 μm or more; and where, by dividing that number by the length of the straight line, a reference number per 1 μm of the straight line is calculated, an average value of the reference numbers of the three straight lines is 0.8 (1/μm) or more; or, the metallic filler particles include flake-like filler particles having a thickness of 1 μm or less and an aspect ratio of 26 or more, and the average value of the reference numbers is 0.4 (1/μm) or more; and (B) In a case where a measurement area formed by connecting 100 four-sided unit areas each with 2 μm per side is provided on the film-thickness-direction cross-section photograph taken by using the scanning electron microscope, and an area occupied by the elastomer in each of the unit areas is measured, a number of unit areas for which an area percentage of the elastomer is 60% or more is 20 unit areas or more.

First, the condition (A) is explained. FIG. 1 illustrates a schematic diagram of a cross-section photograph of a conductive film for explaining the condition (A) in the present invention. FIG. 1 is a schematic diagram for explaining a procedure of calculating the reference numbers of the condition (A). FIG. 1, including the size, shape, number and arrangement of the metallic filler particles, the thickness of the conductive film, and the like, is not intended to limit in any way the conductive film of the present invention.

A cross-section photograph 100 is obtained by capturing an image of a cross-section in a film thickness direction of the conductive film using a scanning electron microscope (SEM). Numerous metallic filler particles 102 are dispersed in an elastomer 101. The metallic filler particles 102 are oriented in a left-right direction (film expansion direction of the conductive film). Neighboring metallic filler particles 102 are mutually in contact with each other. By lining up a plurality of metallic filler particles 102, a conductive path is formed in the elastomer 101.

When judging fulfillment of the condition (A), first, three straight lines α, β and γ extending in an up-down direction (the film thickness direction of the conductive film) are drawn in a central part of the cross-section photograph 100. Spacings between the three straight lines α, β, and γ in the left-right direction are each 3 μm. Length of the three straight lines α, β and γ is L μm. Next, with respect to each of the three straight lines α, β and γ, a count is made of the number of metallic filler particles 102 that intersect the straight lines α, β and γ and that each have a longest portion in the cross-section photograph 100 with a length of 2 μm or more. Here, let this number of the metallic filler particles 102 be x for the straight line α, y for the straight line β, and z for the straight line γ. Next, by dividing each of the numbers by the length L μm of the straight line, a reference number per 1 μm of each straight line is calculated. Here, the reference numbers for the straight lines respectively become x/L (1/μm), y/L (1/μm), and z/L (1/μm). Finally, an average value of the three reference numbers [(x+y+z)/(3 L)] is calculated. Then, whether the obtained average value is 0.8 (1/μm) or more, or 0.4 (1/μm) or more and less than 0.8 (1/μm), is judged. In the case where the average value of the reference numbers is 0.4 (1/μm) or more and less than 0.8 (1/μm), whether the conductive film contains flake-like filler particles having a thickness of 1 μm or less and an aspect ratio of 26 or more is further judged. In this way, the fulfillment of the condition (A) is judged. As the thickness of the flake-like filler particles, an average thickness is adopted. As the aspect ratio, a value obtained by dividing a maximum length of the filler particles by the average thickness (aspect ratio=maximum length/average thickness) is adopted. A method for measuring the average thickness will be described later.

In the condition (A) of the present invention, that the average value of the reference numbers is 0.8 (1/μm) or more, or that the metallic filler particles include flake-like filler particles having a thickness of 1 μm or less and an aspect ratio of 26 or more and the average value of the reference numbers is 0.4 (1/μm) or more, indicates that there are a large number of conductive paths. That is, it indicates that the conductive film is superior in conductivity. The larger the average value of the reference numbers, the more unlikely the conductive paths will be broken even when the conductive film is extended. That is, even when the conductive film is extended, the electrical resistance hardly changes. Thus, the condition (A) is an indicator of conductivity.

Next, the condition (B) is explained. FIG. 2 illustrates a schematic diagram of a cross-section photograph of a conductive film for explaining the condition (B) in the present invention. FIG. 3 illustrates a schematic diagram enlarging one of the unit areas. For convenience of explanation, in FIG. 2, the elastomer and the metallic filler particles are not illustrated. FIG. 2 and FIG. 3 are schematic diagrams for explaining the unit areas and the measurement area of the condition (B). FIG. 2 and FIG. 3, including the size, shape, number and arrangement of the metallic filler particles, the thickness of the conductive film, and the like, are not intended to limit in any way the conductive film of the present invention.

When judging fulfillment of the condition (B), first, as FIG. 2 illustrates, a square measurement area M with 20 μm per side is provided on the cross-section photograph 100, which is obtained by capturing an image of a cross-section in the film thickness direction of the conductive film using a scanning electron microscope (SEM). The measurement area M is partitioned into 10×10 (=100) unit areas E. A unit area E is a square with 2 μm per side. As FIG. 3 illustrates, in the unit area E, the elastomer 101 and the metallic filler particles 102 are observed. Next, for each unit area E, an area occupied by the elastomer 101 is measured. Then, as illustrated in FIG. 2 by hatching, a count is made of the number of unit areas E for which an area percentage of the elastomer 101 is 60% or more. Next, whether this number is 20 or more is judged. In this way, the fulfillment of the condition (B) is judged.

Here, the way of arranging the unit areas is not particularly limited. However, from a point of view of equally detecting a filling state of the metallic filler particles in the film thickness direction and the film expansion direction, it is desirable to arrange the same number of unit areas in the film thickness direction and the film expansion direction (10×10) and to make the measurement area a square with 20 μm per side (see FIG. 2). However, it is also possible that 10 unit areas cannot be aligned and arranged in the film thickness direction, such as in a case where the thickness of the conductive film is less than 20 μm or the like. In this case, remaining unit areas that cannot be arranged in the film thickness direction may be additionally arranged in the film expansion direction.

In the condition (B) of the present invention, that the number of unit areas for which the area percentage of the elastomer is 60% or more is 20 unit areas or more indicates that the elastomer component is large, or that there are more areas where the elastomer component continuously presents. That is, it indicates that the conductive film is flexible. Thus, the condition (B) is an indicator of flexibility.

In summary, in a conductive film satisfying the above conditions (A) and (B), conductive paths for achieving a desired conductivity can be efficiently formed. That is, a high conductivity is ensured using a smaller amount of the metallic filler particles. Thus, by achieving a filling state of the metallic filler particles satisfying the above conditions (A) and (B), the conductive paths can be controlled and the metallic filler particles can be unevenly distributed. As a result, a conductive film can be obtained that is flexible, highly conductive, and for which the electrical resistance hardly changes when the conductive film is extended.

(2) A transducer of the present invention includes a dielectric film made of an elastomer; a plurality of electrodes arranged across the dielectric film; and wirings connected to each of the plurality of electrodes. Of the electrodes and the wirings, at least one is made of the above conductive film of the present invention.

A transducer is a device that converts one kind of energy into another kind of energy. Transducers include, for example, an actuator, a sensor, an electric generating element, and the like, performing conversion between electrical energy and mechanical energy. According to the transducer of the present invention, of the electrodes and the wirings, at least one is formed from the above conductive film of the present invention. Thus, when a member on which the electrodes and the wirings are formed deforms, the electrodes and the wirings extend and contract to follow the deformation of the member. Therefore, the movement of the transducer is not interfered with by the electrodes and the wirings. In addition, with respect to the electrodes and wirings formed from the conductive film of the present invention, the conductivity hardly decreases when the electrodes and the wirings are extended, and even when the electrodes and the wirings are repeatedly deformed, less heat is generated due to internal resistance. Thus, the transducer of the present invention is superior in durability.

(3) A flexible wiring board of the present invention is provided in which at least a portion of a wiring is formed from the above conductive film of the present invention.

According to the flexible wiring board of the present invention, the wiring extends and contracts to follow deformation of a substrate. Even when the wiring is extended, its conductivity hardly decreases, and even when the extension and contraction are repeated, less heat is generated due to internal resistance. Thus, the flexible wiring board of the present invention is superior in durability.

BRIEF DESCRIPTION OF THE DRAWINGS

FIGS. 7(a) and 7(b) illustrate schematic cross-sectional views of an electric generating element, which is an embodiment of a transducer of the present invention: (a) during extension, and (b) during contraction;

DESCRIPTION OF REFERENCE NUMERALS

Figure 1:
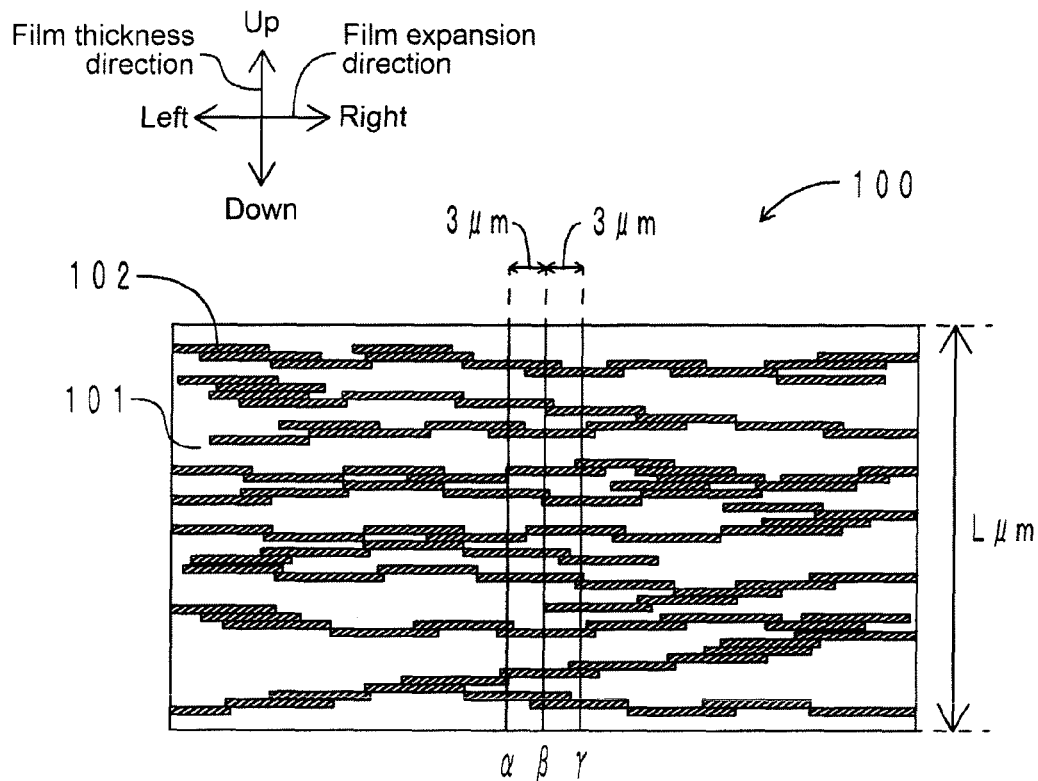
FIG. 1 is a schematic diagram of a cross-section photograph of a conductive film for explaining a condition (A) in the present invention.
Figure 2:
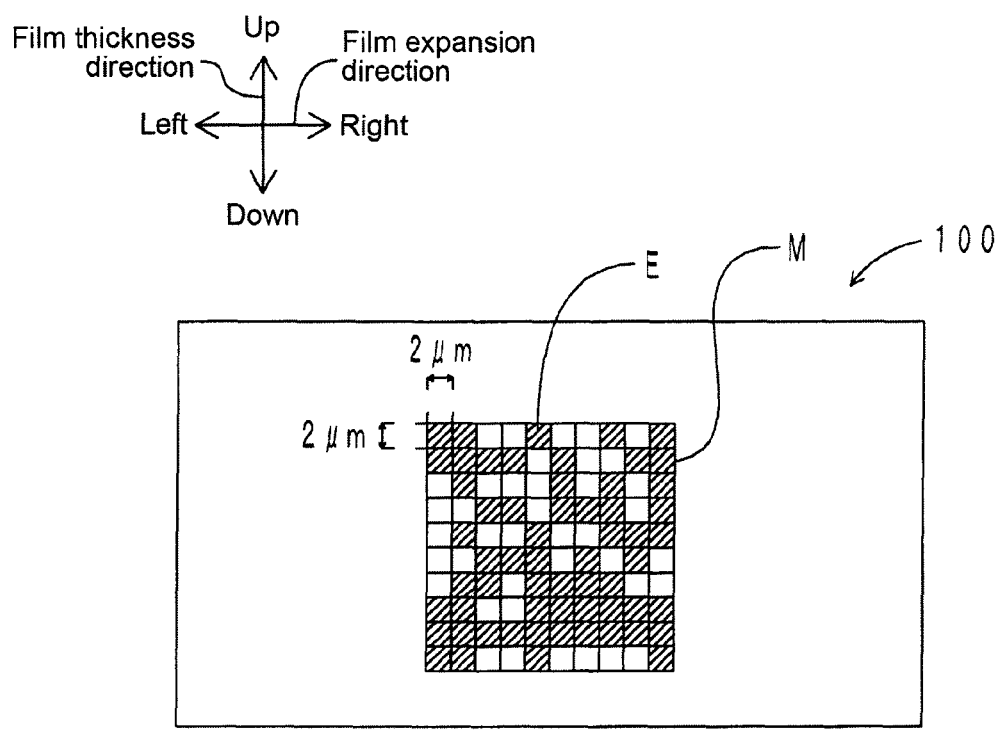
FIG. 2 is a schematic diagram of a cross-section photograph of a conductive film for explaining a condition (B) in the present invention.
Figure 3:
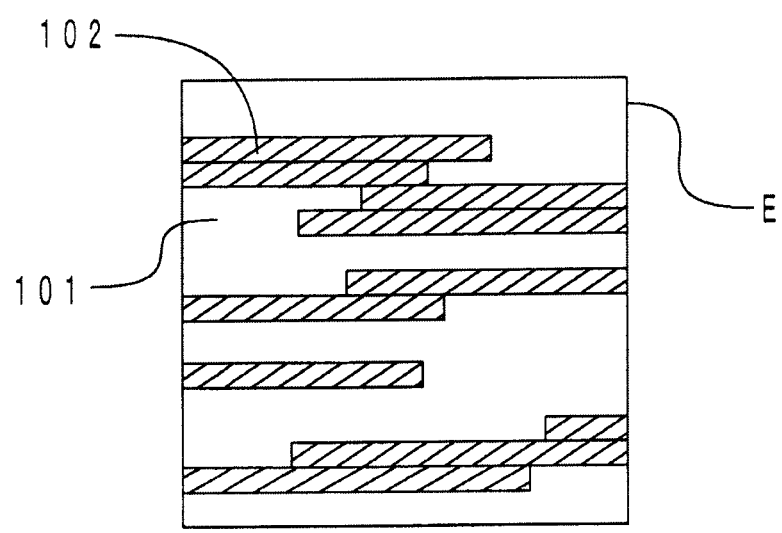
FIG. 3 is a schematic diagram enlarging one unit area.

| | |
|---|---|
| 1: | capacitance-type sensor (transducer) |
| 10: | dielectric film |
| 11a, 11b: | electrodes |
| 12a, 12b: | wirings |
| 13a, 13b: | cover films |
| 14: | connector |
| 2: | actuator (transducer) |
| 20: | dielectric film |
| 21a, 21b: | electrodes |
| 22a, 22b: | wirings |
| 23: | power source |
| 3: | electric generating element (transducer) |
| 30: | dielectric film |
| 31a, 31b: | electrodes |
| 32a-32c: | wirings |
| 4: | flexible wiring board |
| 40: | substrate |
| 41: | upper side wiring connector |
| 42: | under side wiring connector |
| 5: | actuator |
| 50: | dielectric film |
| 51a, 51b: | electrodes |
| 52: | power source |
| 53: | displacement meter |
| 510a, 510b: | terminals |
| 530: | marker |
| 100: | conductive film |
| 101: | elastomer |
| 102: | metallic filler particles |
| 01X-16X: | upper side electrodes |
| 01X1-16X1: | upper side junctions |
| 01Y-16Y: | under side electrodes |
| 01Y1-16Y1: | under side junctions |
| 01x-16x: | upper side wirings |
| 01y-16y: | under side wirings |
| E: | unit area |
| M: | measurement area |

MODE FOR CARRYING OUT THE INVENTION

In the following, embodiments of a conductive film of the present invention, and a transducer and a flexible wiring board using the conductive film, are explained in turn.

<Conductive Film>

An elastomer constituting the conductive film of the present invention may be anything that has a rubber-like elasticity at room temperature. For example, an elastomer having a glass transition temperature (Tg) of −10° C. or lower is flexible, and thus is suitable. When Tg is lower, crystallinity is lower. Therefore, the elastomer has greater breaking elongation. That is, the elastomer can be more easily extended. Therefore, it is desirable that Tg of the elastomer be −20° C. or lower, and more preferably −35° C. or lower. In the present specification, a midpoint glass transition temperature measured according to JIS K7121 (1987) is used as the glass transition temperature.

Further, it is desirable that the elastomer have a functional group capable of hydrogen bonding. A functional group capable of hydrogen bonding has a high affinity for metallic filler particles. For this reason, peeling at an interface between the elastomer and metallic filler particles is unlikely to occur. Therefore, even when the conductive film is extended, cracks are unlikely to occur in the conductive film and the electrical resistance also is unlikely to increase. Examples of a functional group capable of hydrogen bonding include, for example, an ester group, a urethane bond, a urea bond, a halogen group, a hydroxyl group, a carboxyl group, an amino group, a sulfonic acid group, an ether bond, and the like. Among these, those having an ester group are preferable.

The elastomer may be selected by considering a mechanical load applied to the conductive film, temperature and humidity at which the conductive film is used, adhesion with a substrate, and the like. As the elastomer, one kind alone may be used, or a mixture of two or more kinds may also be used. For example, an acrylic rubber, a urethane rubber, a hydrin rubber, a silicone rubber, and the like, are preferred. The acrylic rubber has a low crystallinity and a weak intermolecular force, and thus has a low Tg as compared to the other rubbers. Therefore, the acrylic rubber is flexible, well extendable, and suitable for an electrode and the like of an actuator. It is desirable that the acrylic rubber contain 50% by mole or more of an acrylic acid ester monomer unit having an alkyl group of four or more carbon atoms. When the alkyl group is large (the number of carbon atoms is large), the crystallinity decreases. Therefore, the elastic modulus of the acrylic rubber further decreases. The urethane rubber is superior in mechanical strength, and thus is suitable for applications in which a mechanical load is applied. The hydrin rubber and the silicone rubber are superior in environmental stability, and thus are suitable for applications in which changes in environment, such as temperature, humidity, and the like, are large.

The elastomer may contain additives such as a plasticizer, a processing aid, a cross-linker, a cross-linking promoter, a cross-linking aid, an anti-aging agent, a flexibilizer, a coloring agent, and the like. For example, when a plasticizer is added, workability of the elastomer can be improved, and at the same time flexibility of the elastomer can also be further improved. As the plasticizer, organic acid derivatives such as commonly known phthalate diester and the like, phosphoric acid derivatives such as tricresyl phosphate and the like, adipic acid diester, chlorinated paraffin, polyether ester, and the like, may be used.

The cross-linker, cross-linking promoter, cross-linking aid, and the like that contribute to the cross-linking reaction, may be suitably determined according to the kind of the elastomer and the like. For example, when the cross-linker contains sulfur, the metallic filler particles may be sulfurized. This may increase surface electrical resistance of the metallic filler particles and thus decrease conductivity. Therefore, as the cross-linker and the like, it desirable that a compound that does not contain sulfur be used.

The material of the metallic filler particles filling the elastomer is not particularly limited, and, from a point of view of having a higher conductivity than carbon black and being corrosion-resistant, may be suitably selected from, for example, silver, gold, copper, nickel, rhodium, palladium, chromium, titanium, platinum, iron, their alloys, and the like. Among these, silver has low electrical resistance and is therefore preferred.

Further, non-metallic particles having surfaces coated with a metal may also be used. In this case, as compared to a case where the filler particles consist only of metal, specific gravity of the filler particles can be reduced. Therefore, when used in a coating material, sedimentation of the metallic filler particles is inhibited and dispersiveness is improved. In addition, by processing the particles, the metallic filler particles can be easily produced in various forms. Further, cost of the metallic filler particles can be reduced. As the coating metal, the metals listed in the above as suitable for metallic filler particles can be used. As the non-metallic particles, carbon materials such as graphite and carbon black; metal oxides such as calcium carbonate, titanium dioxide, aluminum oxide and barium titanate; inorganic substances such as silica; resins such as acrylic and urethane; and the like, may be used.

From a point of view of increasing contact area between filler particles to improve conductivity, it is desirable that the metallic filler particles be flake-like or needle-like in shape having a thickness of 1 μm or less, and contain anisotropic filler particles oriented in the film expansion direction. The anisotropic filler particles may be arranged in the elastomer in a way in which a longitudinal direction of the anisotropic filler particles is nearly parallel to the film expansion direction.

An average particle size of the anisotropic filler particles is not particularly limited, but is preferred to be, for example, 2.5 μm or more and 20 μm or less. When the average particle size is less than 2.5 μm, overlapping area between the filler particles is small, and thus the electrical resistance is likely to increase when the conductive film is extended. On the other hand, when the average particle size is greater than 15 μm, the flexibility of the conductive film degrades. In the present specification, as the average particle size of the metallic filler particles, a value measured using a "Microtrac particle size distribution analyzer UPA-EX150" manufactured by Nikkiso Co. Ltd. is adopted.

That the thickness of the flake-like anisotropic filler particles (which may be referred to as "flake-like filler particles" in the following) was chosen to be 1 μm or less is for the following reasons. That is, in order to form a conductive path in the elastomer using the flake-like filler particles, it is necessary to fill the elastomer with more than a predetermined number of the flake-like filler particles. Here, when the thickness of the flake-like filler particles is thin, even when the same number of flake-like filler particles is used, a total mass of the filled flake-like filler particles is reduced. In addition, a volume percentage of the flake-like filler particles in the elastomer also is reduced. Therefore, a volume percentage of the elastomer is increased accordingly, and thus the flexibility of the conductive film can be improved. For this reason, the thickness of the flake-like filler particles was chosen to be 1 μm or less. It is more preferable that the thickness of the flake-like filler particles be 0.5 μm or less. The "thickness" of the flake-like filler particles means an average thickness of one filler particle.

It is desirable that the flake-like filler particles contain filler particles having an aspect ratio of 26 or more. The larger the aspect ratio, the more likely the filler particles will overlap and the more likely a conductive path will form. The aspect ratio is calculated by dividing a maximum length of the flake-like filler particles by the average thickness (aspect ratio=maximum length/average thickness). Here, the maximum length of the flake-like filler particles in the conductive film can be measured as follows. First, the polymer component is removed from the conductive film to extract metallic filler particles (including the flake-like filler particles). Then, an SEM photograph of the extracted metallic filler particles is taken and the maximum length of the flake-like filler particles is measured from the SEM photograph. The average thickness of the flake-like filler particles in the conductive film can be measured as follows. First, the metallic filler particles extracted from the conductive film are embedded in an epoxy resin. Next, the embedded test specimen is cut in a thickness direction of the metallic filler particles, and an SEM photograph of the cross-section of the test specimen is taken. Next, the average thickness is calculated by performing an image analysis of a cross-sectional image of the flake-like filler particles in the SEM photograph.

As the metallic filler particles, in addition to the above-mentioned anisotropic filler particles, various filler particles having different shapes and sizes can be used. Among these, it is desirable to combine the use of block-shaped filler particles having an average particle size of 0.1 μm or more and 1.5 μm or less. Here, "block-shaped" means shapes including a spherical shape, nearly spherical shapes (elliptical shapes, elongated spherical shapes (a pair of hemispheres facing each other connected by a column), and the like), as well as indefinite shapes having concave-convex surfaces.

For example, when using only the anisotropic filler particles, the anisotropic filler particles in contact with each other are sheared by contact surfaces during extension. Therefore, flexibility of the conductive film may be degraded. In this respect, when the anisotropic filler particles and the block-shaped filler particles are combined, the block-shaped filler particles enter between the anisotropic filler particles. Then, the anisotropic filler particles become unevenly distributed. Thereby, less shearing between the anisotropic filler particles occurs, and degradation of the flexibility is inhibited.

It is desirable that the average particle size of the block-shaped filler particles be 0.1 μm or more and 1.5 μm or less. When the average particle size is less than 0.1 μm, specific surface is large. Therefore, reinforcement increases and flexibility of the conductive film degrades. It is more preferable that the average particle size be 0.3 μm or more. On the other hand, when the average particle size is larger than 1.5 μm, it is hard for the block-shaped filler particles to enter into gaps between the anisotropic filler particles.

Further, in order to produce an effect of improving the flexibility due to the block-shaped filler particles, it is desirable that a content ratio between the anisotropic filler particles and the block-shaped filler particles be from 2:1 to 50:1 in mass ratio.

As described above, the conductive film of the present invention satisfies the following conditions (A) and (B). (A) In a case where three straight lines extending in a film thickness direction are drawn on a film-thickness-direction cross-section photograph taken by using a scanning electron microscope with spacings of 3 μm each between the three straight lines in a film expansion direction; where, with respect to each of the straight lines, a count is made of the number of metallic filler particles that intersect the straight line and that each have a longest portion in the cross-section photograph with a length of 2 μm or more; and where, by dividing that number by the length of the straight line, a reference number per 1 μm of the straight line is calculated, an average value of the reference numbers of the three straight lines is 0.8 (1/μm) or more; or, the metallic filler particles contains flake-like filler particles having a thickness of 1 μm or less and an aspect ratio of 26 or more, and the average value of the reference numbers is 0.4 (1/μm) or more; and (B) In a case where a measurement area formed by connecting 100 four-sided unit areas each with 2 μm per side is provided on the film-thickness-direction cross-section photograph taken by using a scanning electron microscope, and an area occupied by the elastomer in each of the unit areas is measured, a number of unit areas for which an area percentage of the elastomer is 60% or more is 20 unit areas or more.

The conductive film of the present invention, in which the metallic filler particles are filled so as to satisfy the above conditions (A) and (B), has high conductivity even when the filling amount of the metallic filler particles is relatively small. For example, when the volume of the conductive film is 100% by volume, it is desirable that the filling amount of the metallic filler particles be less than 45% by volume, more preferably less than 42% by volume, and even more preferably less than 38% by volume.

The conductive film of the present invention, for example, can be produced by molding and extruding a conductive material, which is formed by kneading a polymer as the elastomer component (including additives as appropriate) and the metallic filler particles with a pressurizing kneader such as a kneader, a Banbury mixer, and the like; a two-roll mill; a three-roll mill; or the like. Alternatively, the conductive film can also be produced as follows. First, a conductive coating material is prepared by adding the metallic filler particles to a solution in which a polymer as the elastomer component and a predetermined additive are dissolved in a solvent, and then stirring and mixing the mixture. Next, the prepared conductive coating material is applied to a substrate, and dried by heating. In this case, during heating, the elastomer component may be allowed to undergo a cross-linking reaction. Further, in order to improve the orientation of the metallic filler particles in the conductive film, the conductive coating material may be caused to flow in an orientation direction during application of the conductive coating material, and the formed conductive film may be subjected to processing such as hot press, stretching, and the like.

As the application method of the conductive coating material, various commonly known methods can be adopted, for example, printing methods such as ink jet printing, flexographic printing, gravure printing, screen printing, pad printing, lithography, and the like, as well as dipping methods, spray methods, bar coating methods, and the like. For example, when a printing method is adopted, distinction between an application portion and a non-application portion can be easily performed. In addition, printing of a large area, a thin line, and a complex shape can also be easily performed. Among the printing methods, the screen printing method is preferable because high viscosity conductive coating material can be used, film thickness can be easily adjusted, and the metallic filler particles are likely to become oriented.

The thickness of the conductive film of the present invention may be suitably determined according to an intended use. For example, in a case where the conductive film of the present invention is used as electrodes and wirings of an elastomeric sensor or an actuator, from a point of view of miniaturization of the elastomeric sensor and the actuator and minimizing as much as possible an impact on deformation of a dielectric film, it is desirable that the thickness of the conductive film be thin. For example, it is desirable that the thickness of the conductive film be 4 μm or more and 1000 μm or less, and more preferably 10 μm or more and 50 μm or less.

Further, the conductive film of the present invention may be formed on a surface of a substrate, a dielectric film, and the like, according to an intended use. Examples of the substrate include, for example, flexible resin films formed from polyimide, polyethylene, polyethylene terephthalate (PET), polyethylene naphthalate (PEN), and the like. When the conductive film of the present invention is formed on a surface of an elastic member made of an elastomer, effects such as high flexibility and an electrical resistance that hardly increases even when the conductive film is extended can be better produced. Here, the elastic member includes a dielectric film in an actuator and the like. A thin-film elastic member, for example, can be produced by applying a coating material for forming the elastic member on a releasable substrate and then cutting the formed film into a desired form and peeling the formed film off.

The conductive film of the present invention is suitable for electrodes and wirings of a transducer, wirings of a flexible wiring board, and the like. In the following, first, as examples of a transducer using the conductive film of the present invention, embodiments of an elastomeric sensor, an actuator, and an electric generating element are explained; and next, an embodiment of a flexible wiring board is explained. In the transducer and the flexible wiring board of the present invention, it is desirable to adopt the above-described preferred embodiment of the conductive film of the present invention.

<Elastomeric Sensor>

Figure 4:
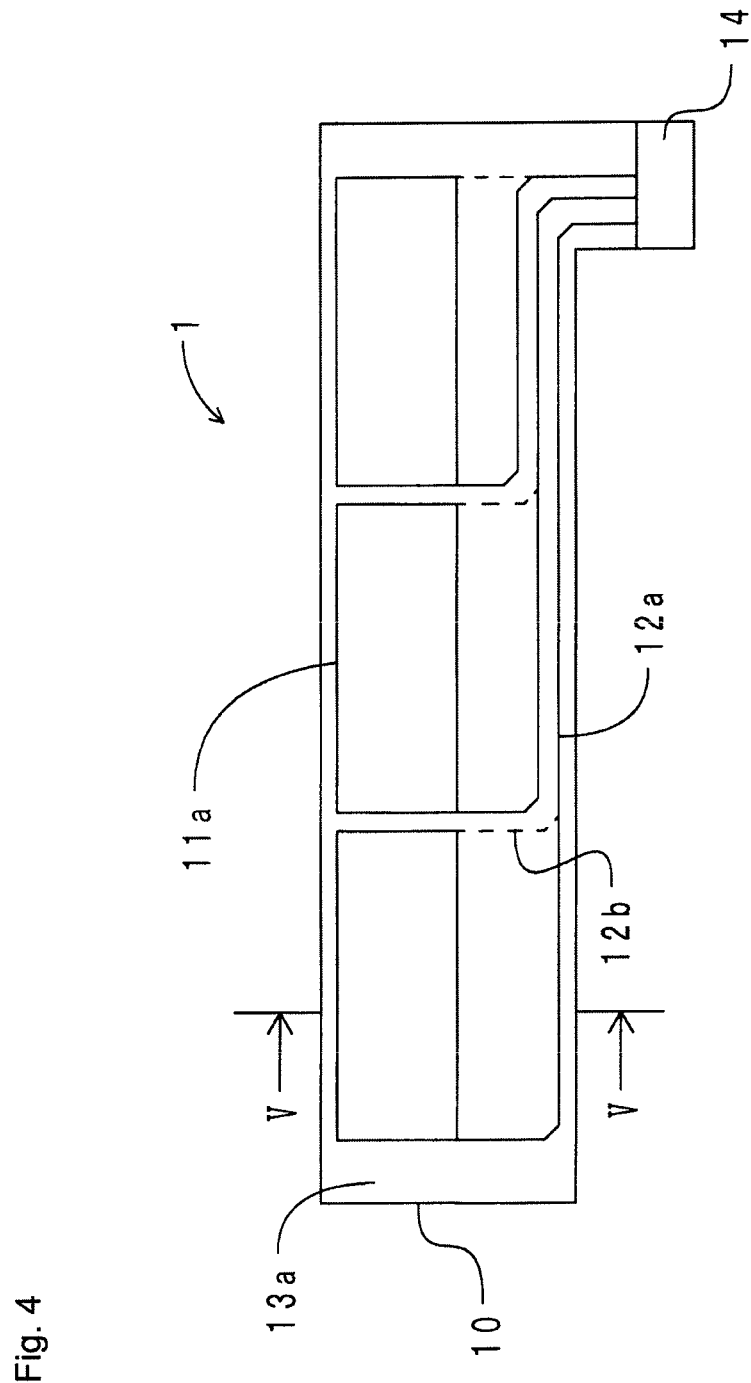
FIG. 4 is a top view of a capacitance-type sensor, which is an embodiment of a transducer of the present invention.
Figure 5:
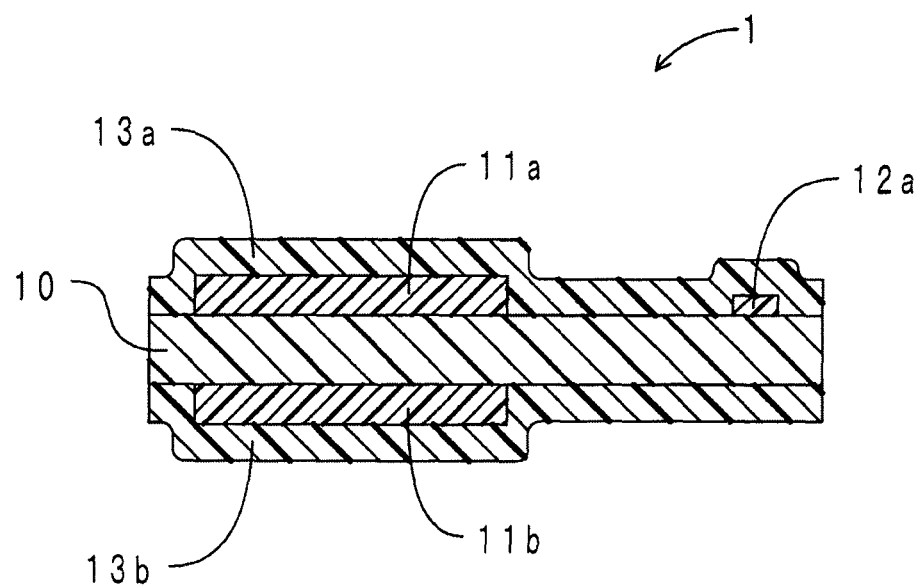
FIG. 5 is a cross-sectional view along a line V-V in FIG. 4.

As an example of an elastomeric sensor using the conductive film of the present invention for electrodes and wirings, an embodiment of a capacitance-type sensor is explained. First, a configuration of the capacitance-type sensor of the present embodiment is explained. FIG. 4 illustrates a top view of a capacitance-type sensor. FIG. 5 illustrates a cross-sectional view along a line V-V in FIG. 4. As FIG. 4 and FIG. 5 illustrate, a capacitance-type sensor 1 includes a dielectric film 10, a pair of electrodes 11a and 11b, wirings 12a and 12b, and cover films 13a and 13b.

The dielectric film 10 is made of a urethane rubber, and has a belt-like shape extending in a left-right direction. The dielectric film 10 has a thickness of about 300 μm.

The electrode 11a has a rectangular shape. Three electrodes 11a are formed by screen printing on an upper surface of the dielectric film 10. Similarly, the electrode 11b has a rectangular shape. Three electrodes 11b are formed on an under surface of the dielectric film 10 so as to face the electrodes 11a across the dielectric film 10. The electrodes 11b are screen printed on the under surface of the dielectric film 10. Thus, across the dielectric film 10, three pairs of the electrodes 11a and 11b are arranged. The electrodes 11a and 11b are formed from the conductive film of the present invention.

The wirings 12a are each connected to each of the electrodes 11a formed on the upper surface of the dielectric film 10. Via the wirings 12a, the electrodes 11a and a connector 14 are connected. The wirings 12a are formed by screen printing on the upper surface of the dielectric film 10. Similarly, the wirings 12b are each connected to each of the electrodes 11b formed on the under surface of the dielectric film 10 (dotted lines in FIG. 4). Via the wirings 12b, the electrodes 11b and a connector (not shown in the drawings) are connected. The wirings 12b are formed by screen printing on the under surface of the dielectric film 10. The wirings 12a and 12b are formed from the conductive film of the present invention.

The cover film 13a is made of an acrylic rubber, and has a belt-like shape extending in the left-right direction. The cover film 13a covers the upper surface of the dielectric film 10, the electrodes 11a, and the wirings 12a. Similarly, the cover film 13b is made of an acrylic rubber, and has a belt-like shape extending in the left-right direction. The cover film 13b covers the under surface of the dielectric film 10, the electrodes 11b, and the wirings 12b.

Next, operation of the capacitance-type sensor 1 is explained. For example, when the capacitance-type sensor 1 is pressed from above, the dielectric film 10, the electrodes 11a and the cover film 13a together curve downward. Due to compression, thickness of the dielectric film 10 decreases. As a result, capacitance between the electrodes 11a and 11b increases. From the change in the capacitance, deformation due to the compression is detected.

Next, an operation effect of the capacitance-type sensor 1 of the present embodiment is explained. According to the capacitance-type sensor 1 of the present embodiment, the dielectric film 10, the electrodes 11a and 11b, the wirings 12a and 12b and the cover films 13a and 13b are all formed from elastomeric materials. Therefore, the capacitance-type sensor 1 as a whole is flexible, and extendable and contractible. In addition, the electrodes 11a and 11b and the wirings 12a and 12b can deform following the deformation of the dielectric film 10. Further, the electrodes 11a and 11b and the wirings 12a and 12b have high conductivity, and their electrical resistances hardly increase even when being extended. Therefore, the capacitance-type sensor 1 has good responsiveness. In the capacitance-type sensor 1 of the present embodiment, three pairs of opposing electrodes 11a and 11b are formed across the dielectric film 10. However, the number, size, arrangement, and the like of the electrodes may be suitably determined according to an intended use.

<Actuator>

Figure 6A:
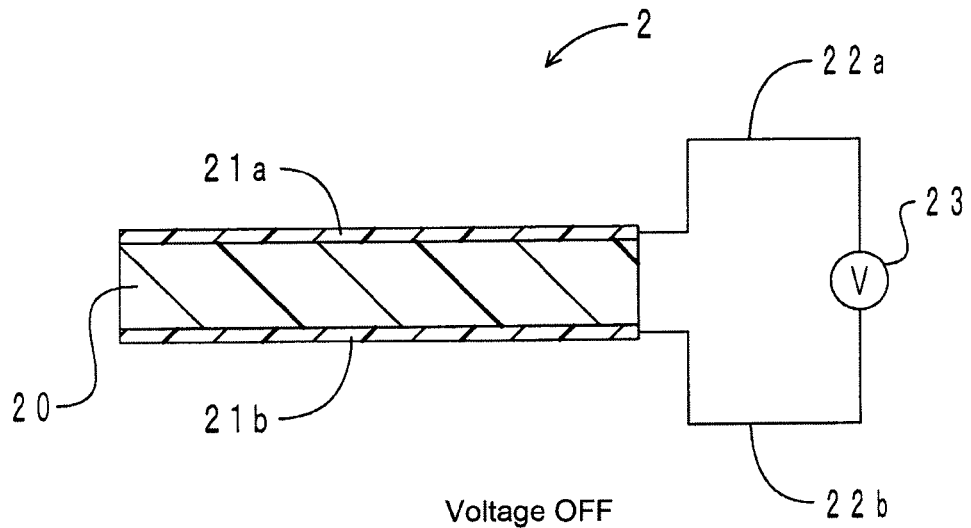
FIGS. 6(a) and 6(b) illustrate schematic cross-sectional views of an actuator, which is an embodiment of a transducer of the present invention: (a) in an OFF state, and (b) in an ON state.
Figure 6B:
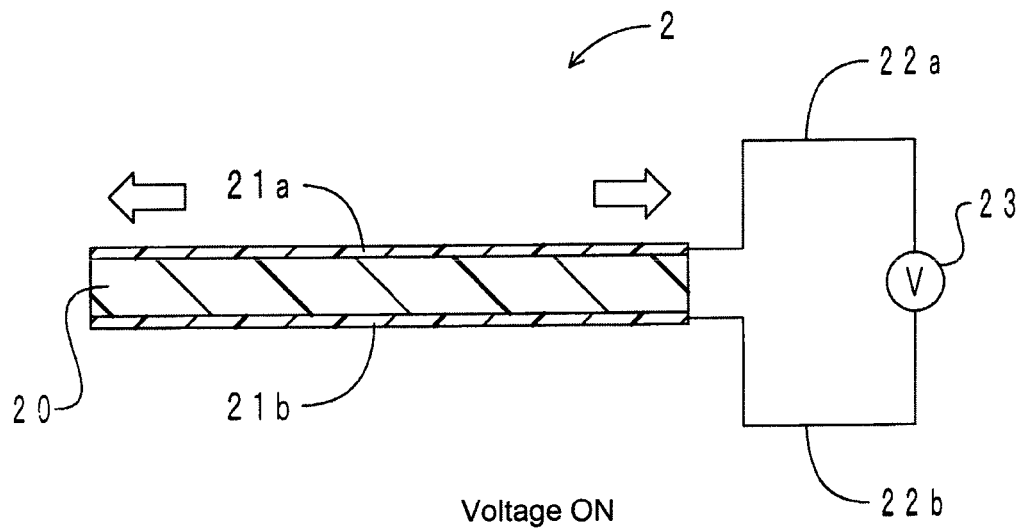

An embodiment of an actuator using the conductive film of the present invention for electrodes is explained. FIGS. 6(a) and 6(b) illustrate schematic cross-sectional views of an actuator of the present embodiment: (a) in an OFF state, and (b) in an ON state. As FIGS. 6(a) and 6(b) illustrate, an actuator 2 includes a dielectric film 20, electrodes 21a and 21b, and wirings 22a and 22b. The dielectric film 20 is made of a urethane rubber. The electrode 21a is arranged so as to cover nearly the whole of an upper surface of the dielectric film 20. Similarly, the electrode 21b is arranged so as to cover nearly the whole of an under surface of the dielectric film 20. The electrodes 21a and 21b are respectively connected to a power source 23 via the wirings 22a and 22b. The electrodes 21a and 21b are both formed from the conductive film of the present invention.

When switching from the OFF state to the ON state, a voltage is applied between the paired electrodes 21a and 21b. By applying the voltage, the thickness of the dielectric film 20 decreases. As a result, as illustrated in FIG. 6(b) by the white arrows, the dielectric film 20 extends in a direction parallel to the faces of the electrodes 21a and 21b. Thereby, the actuator 2 outputs a driving force in the horizontal and vertical directions in FIGS. 6(a) and 6(b).

According to the present embodiment, the electrodes 21a and 21b are flexible and extendable and contractible, and therefore can deform following the deformation of the dielectric film 20. That is, the movement of the dielectric film 20 is not interfered with by the electrodes 21a and 21b. Therefore, with the actuator 2, greater force and displacement can be obtained. Further, with respect to the electrodes 21a and 21b, even when they are extended, their electrical resistances hardly increase. Thus, less heat is generated due to internal resistance, and the electrodes 21a and 21b are less likely to degrade. That is, the actuator 2 is superior in durability. When a laminate structure is adopted in which a plurality of dielectric films and electrodes are alternatingly laminated, a greater force can be generated. This increases the output of the actuator, and allows a driven object member to be driven with a greater force.

<Electric Generating Element>

An embodiment of an electric generating element using the conductive film of the present invention for electrodes is explained. FIGS. 7(a) and 7(b) illustrate schematic cross-sectional views of an electric generating element of the present embodiment: (a) during extension, and (b) during contraction. As FIGS. 7(a) and 7(b) illustrate, an electric generating element 3 includes a dielectric film 30, electrodes 31a and 31b, and wirings 32a-32c. The dielectric film 30 is made of a urethane rubber. The electrode 31a is arranged so as to cover nearly the whole of an upper surface of the dielectric film 30. Similarly, the electrode 31b is arranged so as to cover nearly the whole of an under surface of the dielectric film 30. The wirings 32a and 32b are connected to the electrode 31a. That is, the electrode 31a is connected to an external load (not shown in the drawings) via the wiring 32a. Further, the electrode 31*a* is connected to a power source (not shown in the drawings) via the wiring 32*b*. The electrode 31*b* is grounded via the wiring 32*c*. The electrodes 31*a* and 31*b* are both formed from the conductive film of the present invention.

As FIG. 7(*a*) illustrates, when the electric generating element 3 is compressed and the dielectric film 30 is extended in a direction parallel to the faces of the electrodes 31*a* and 31*b*, the thickness of the dielectric film 30 decreases, and electrical charges accumulate between the electrodes 31*a* and 31*b*. Thereafter, when the compression force is removed, as FIG. 7(*b*) illustrates, by an elastic restoring force of the dielectric film 30, the dielectric film 30 contracts and the thickness of the dielectric film 30 increases. During this, the accumulated electrical charges are released via the wiring 32*a*.

According to the present embodiment, the electrodes 31*a* and 31*b* are flexible and extendable and contractible. Therefore, the movement of the dielectric film 30 is not interfered with by the electrodes 31*a* and 31*b*. Further, with respect to the electrodes 31*a* and 31*b*, even when they are extended, their electrical resistances hardly increase. Therefore, even when repeatedly deformed, less heat is generated by internal resistance. Therefore, the electric generating element 3 is superior in durability.

<Flexible Wiring Board>

Figure 8:
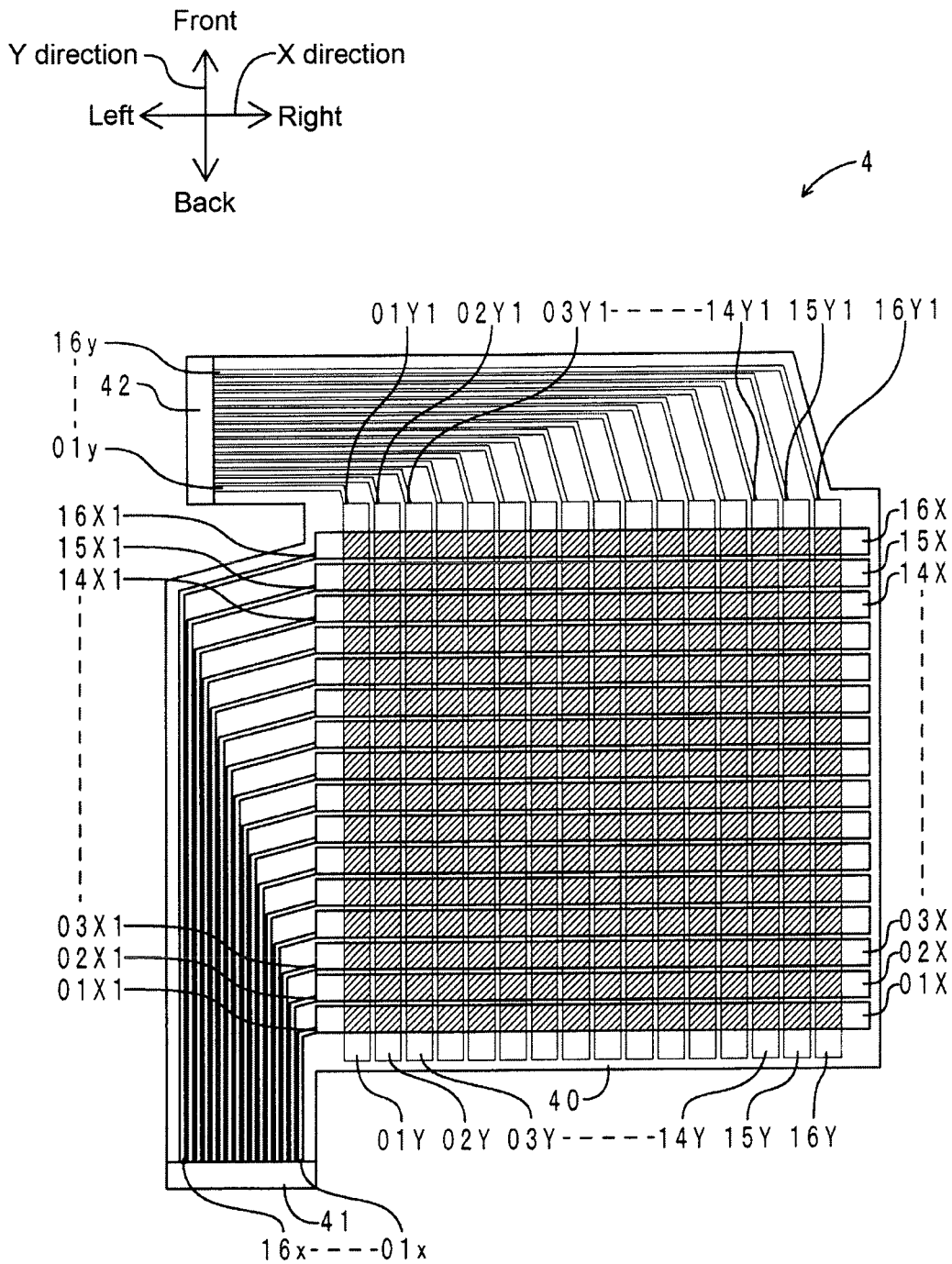
FIG. 8 is a transparent top view of a flexible wiring board, which is an embodiment of the present invention.

An embodiment of a flexible wiring board using the conductive film of the present invention for wirings is explained. FIG. 8 illustrates a transparent top view of a flexible wiring board of the present embodiment. In FIG. 8, wiring on an under side is illustrated with thin lines. As FIG. 8 illustrates, a flexible wiring board 4 includes a substrate 40, upper side electrodes 01X-16X, upper side electrodes 01X-16X, upper side wirings 01*x*-16*x*, under side wirings 01*y*-16*y*, an upper side wiring connector 41, and an under side wiring connector 42.

The substrate 40 is made of a urethane rubber and has a sheet-like shape. A total of sixteen upper side electrodes 01X-16X are arranged on an upper surface of the substrate 40. Each of the upper side electrodes 01X-16X has a belt-like shape. Each of the upper side electrodes 01X-16X extends in an X direction (left-right direction). The upper side electrodes 01X-16X are arranged nearly parallel to each other at predetermined spacings in a Y direction (front-back direction). Upper side junctions 01X1-16X1 are respectively arranged on left ends of the upper side electrodes 01X-16X. Similarly, a total of sixteen under side electrodes 01Y-16Y are arranged on an under surface of the substrate 40. Each of the under side electrodes 01Y-16Y has a belt-like shape. Each of the under side electrodes 01Y-16Y extends in the Y direction. The under side electrodes 01Y-16Y are arranged nearly parallel to each other at predetermined spacings in the X direction. Under side junctions 01Y1-16Y1 are respectively arranged on front ends of the under side electrodes 01Y-16Y. As illustrated in FIG. 8 by hatching, detectors detecting a load and the like are formed by intersecting portions (overlapping portions) across the substrate 40 of the upper side electrodes 01X-16X and the under side junctions 01Y1-16Y1.

A total of sixteen upper side wirings 01*x*-16*x* are arranged on the upper surface of the substrate 40. Each of the upper side wirings 01*x*-16*x* has a line-like shape. The upper side wiring connector 41 is arranged at a left rear corner of the substrate 40. The upper side wirings 01*x*-16*x* respectively connect the upper side junctions 01X1-16X1 with the upper side wiring connector 41. The upper surface of the substrate 40, the upper side electrodes 01X-16X, and the upper side wirings 01*x*-16*x*, are covered from above by an upper side cover film (not shown in the drawings). The upper side wirings 01*x*-16*x* are formed from the conductive film of the present invention.

A total of sixteen under side wirings 01*y*-16*y* are arranged on the under surface of the substrate 40. Each of the under side wirings 01*y*-16*y* has a line-like shape. The under side wiring connector 42 is arranged at a left front corner of the substrate 40. The under side wirings 01*y*-16*y* respectively connect the under side junctions 01Y1-16Y1 with the under side wiring connector 42. The under surface of the substrate 40, the under side electrodes 01Y-16Y, and the under side wirings 01*y*-16*y*, are covered from below by an under side cover film (not shown in the drawings). The under side wirings 01*y*-16*y* are formed from the conductive film of the present invention.

A calculator (not shown in the drawings) is electrically connected to each of the upper side wiring connector 41 and the under side wiring connector 42. Impedances of the detectors are input to the calculator via the upper side wirings 01*x*-16*x* and the under side wirings 01*y*-16*y*. Based on this, surface pressure distribution is measured.

According to the present embodiment, the upper side wirings 01*x*-16*x* and the under side wirings 01*y*-16*y* are flexible and extendable and contractible, and therefore can deform following the deformation of the substrate 40. Further, with respect to the upper side wirings 01*x*-16*x* and the under side wirings 01*y*-16*y*, even when they are extended, their electrical resistances hardly increase. Therefore, even when repeatedly deformed, less heat is generated by internal resistance. Therefore, the flexible wiring board 4 is superior in durability.

Embodiments

In the following, the present invention is specifically explained using embodiments.

<Preparation of Conductive Film>

Embodiments 1-4

First, two kinds of monomers were suspension polymerized to produce an acrylic rubber polymer. As the monomers, n-butyl acrylate (BA) and allyl glycidyl ether (AGE) were used. Mixing ratios of the monomers were 98% by mass of BA and 2% by mass of AGE. A weight-average molecular weight of the obtained acrylic rubber polymer was measured using gel permeation chromatography (GPC), and the result was about 900,000. Tg of the acrylic rubber polymer was −46+ C.

Next, 100 parts by mass of the prepared acrylic rubber polymer, 1 part by mass of stearic acid as a processing aid ("LUNAC (registered trademark) S30" manufactured by Kao Co., Ltd.), and 1 part by mass of sodium benzoate as a cross-linker ("VULNOC (registered trademark) AB-S" manufactured by Ouchi Shinko Chemical Industrial Co., Ltd.) were mixed using a roll kneader to prepare an elastomer composition.

Next, the prepared elastomer composition was dissolved in ethylene glycol monobutyl ether acetate as a solvent to prepare an elastomer solution. As metallic filler particles, predetermined silver powder was added to the elastomer solution, which was then kneaded using a three-roll mill to prepare a conductive coating material. With respect to the silver powder, the following three kinds were used as appropriate. Silver powder A: "Nanomeruto (registered trademark) Ag-XF" manufactured by Fukuda Metal Foil & Powder Co., Ltd. (flake-like; average particle size is about 5 µm; thickness is about 0.2 µm; and aspect ratio is 25). Silver powder B: "FA-D-4" manufactured by DOWA Electronics Materials Co., Ltd. (flake-like; average particle size is about 15 µm; thickness is about 0.9 µm; and aspect ratio is 16.7). Silver powder C: "AG2-1C" manufactured by DOWA Electronics Materials Co., Ltd. (spherical; average particle size is about 0.5 μm; and aspect ratio is 1).

The prepared conductive coating material was applied using a bar coating method on a surface of a substrate made of an acrylic resin. Thereafter, the substrate having the coated film formed thereon was placed in a drying oven of a temperature of about 150° C. for about 30 minutes to dry the coated film and to allow a cross-linking reaction to proceed, and thereby a conductive film was obtained. The obtained conductive film had a thickness of about 20 μm.

Embodiment 5

A conductive film was prepared in the same way as that for the embodiment 1 except that a urethane rubber was used instead of an acrylic rubber. As the urethane rubber, "Nippolan (registered trademark) 5230" manufactured by Nippon Polyurethane Industry Co., Ltd. was used. An elastomer solution was prepared by dissolving a urethane rubber polymer in a solvent, without mixing the solution with a cross-linker and a processing aid.

Embodiment 6

A conductive film was prepared in the same way as that for the embodiment 1 except that a hydrin rubber was used instead of an acrylic rubber. As the hydrin rubber, "Epichlomer (registered trademark) CG102" manufactured by Daiso Co., Ltd. was used. An elastomer composition was prepared by using 0.5 parts by mass of triazine thiol (manufactured by Wako Pure Chemical Industries, Ltd.) as a cross-linker, without mixing the composition with a processing aid.

Embodiment 7

A conductive film was prepared in the same way as that for the embodiment 1 except that a silicone rubber was used instead of an acrylic rubber. As the silicone rubber, "TSE-3351", manufactured by Momentive Performance Materials Japan Inc., was used. An elastomer solution was prepared by dissolving a silicone rubber polymer in a solvent, without mixing the solution with a cross-linker and a processing aid.

Embodiment 8

A conductive film was prepared in the same way as that for the embodiments 1-4 except that the kind and amount of the silver powder were changed. As the silver powder, two kinds of silver powders were used, which are silver powder C, which was mentioned above, and silver powder D, which was prepared by flattening spherical silver particles using a ball mill, the spherical silver particles being prepared by using a chemical reduction method and having an average particle size of 2 μm. Particles of the silver powder D are flake-like in shape, and have an average particle size of about 13 μm, a thickness of about 0.2 μm, and an aspect ratio of 65.

Embodiment 9

A conductive film was prepared in the same way as that for the embodiment 5 except that, similar to the embodiment 8, two kinds of silver powders were used.

Embodiment 10

A conductive film was prepared in the same way as that for the embodiment 6 except that, similar to the embodiment 8, two kinds of silver powders were used.

Embodiment 11

A conductive film was prepared in the same way as that for the embodiment 7 except that, similar to the embodiment 8, two kinds of silver powders were used.

Comparative Example 1

A conductive film having a thickness of about 20 μm was formed from a commercially available silver paste ("DOTITE (registered trademark) FA-353N" manufactured by Fujikura Kasei Co., Ltd.).

Comparative Examples 2-4

A conductive film was prepared in the same way as that for the embodiments 1-4 except that the kind and amount of the silver powder were changed.

Table 1 and Table 2 illustrate the elastomer and the kind and amount of the metallic filler particles used with respect to the embodiments and the comparative examples.

TABLE 1

| | | | | | | | | | | | (in parts by mass) |
|---|---|---|---|---|---|---|---|---|---|---|---|
| | | | Embodiment 1 | Embodiment 2 | Embodiment 3 | Embodiment 4 | Comparative example 1 | Comparative example 2 | Comparative example 3 | Comparative example 4 |
| Conductive film | Elastomer | Acrylic rubber | 100 | 100 | 100 | 100 | — | 100 | 100 | 100 |
| | Metallic filler | Silver powder A (flake-like) | 300 | 300 | 200 | 350 | — | — | 500 | — |
| | | Silver powder B (flake-like) | 100 | 300 | — | 150 | — | 350 | 500 | — |
| | | Silver powder C (spherical) | 100 | 50 | — | 100 | — | — | — | 1200 |
| | Metallic filler filling amount [vol %] | | 36 | 41 | 19 | 38 | — | 31 | 48 | 51 |
| | Average value of condition (A) reference numbers [1/μm] | | 1.4 | 1.4 | 0.8 | 1.1 | 0.7 | 0.7 | 1.6 | 0.0 |
| | Number of condition (B) unit areas | | 78 | 30 | 76 | 23 | 14 | 61 | 15 | 0 |
| Evaluation result | Elasticity [MPa] | | 20 | 23 | 4 | 26 | 130 | 7 | 52 | 48 |
| | Natural state volume resistivity [Ωcm] | | $8.1 \times 10^{-5}$ | $5.7 \times 10^{-5}$ | $8.1 \times 10^{-4}$ | $4.5 \times 10^{-5}$ | $5.1 \times 10^{-5}$ | $10^6$ or more | $4.1 \times 10^{-5}$ | $8.1 \times 10^{-5}$ |
| | Volume resistivity during 100% extension [Ωcm] | | $9.2 \times 10^{-4}$ | $3.6 \times 10^{-3}$ | $7.9 \times 10^{-3}$ | $3.1 \times 10^{-3}$ | $10^6$ or more | $10^6$ or more | $10^6$ or more | $7.6 \times 10^1$ |

TABLE 1-continued (in parts by mass)

|  |  | Embodiment 1 | Embodiment 2 | Embodiment 3 | Embodiment 4 | Comparative example 1 | Comparative example 2 | Comparative example 3 | Comparative example 4 |
|---|---|---|---|---|---|---|---|---|---|
| | Applicability to flexible wiring board | ○ | ○ | ○ | ○ | X | X | X | X |
| | Responsiveness of actuator | ○ | ○ | ○ | ○ | X | X | X | X |

TABLE 2

(in parts by mass)

| | | | Embodiment 5 | Embodiment 6 | Embodiment 7 | Embodiment 8 | Embodiment 9 | Embodiment 10 | Embodiment 11 |
|---|---|---|---|---|---|---|---|---|---|
| Conductive film | Elastomer | Acrylic rubber | — | — | — | 100 | — | — | — |
| | | Urethane rubber | 100 | — | — | — | 100 | — | — |
| | | Hydrin rubber | — | 100 | — | — | — | 100 | — |
| | | Silicone rubber | — | — | 100 | — | — | — | 100 |
| | Metallic filler | Silver powder A (flake-like) | 300 | 300 | 300 | — | — | — | — |
| | | Silver powder B (flake-like) | 100 | 100 | 100 | — | — | — | — |
| | | Silver powder C (spherical) | 100 | 100 | 100 | 50 | 50 | 50 | 50 |
| | | Silver powder D (flake-like) | — | — | — | 200 | 200 | 200 | 200 |
| | Metallic filler filling amount [vol %] | | 37 | 39 | 33 | 21 | 22 | 23 | 20 |
| | Average value of condition (A) reference numbers [1/μm] | | 1.4 | 1.3 | 1.1 | 0.4 | 0.5 | 0.6 | 0.5 |
| | Number of condition (B) unit areas | | 47 | 41 | 50 | 67 | 44 | 40 | 42 |
| Evaluation result | Elasticity [MPa] | | 62 | 89 | 90 | 6 | 35 | 39 | 51 |
| | Natural state volume resistivity [Ωcm] | | $3.1 \times 10^{-5}$ | $2.9 \times 10^{-5}$ | $9.3 \times 10^{-5}$ | $3.2 \times 10^{-4}$ | $9.4 \times 10^{-5}$ | $1.7 \times 10^{-4}$ | $9.2 \times 10^{-5}$ |
| | Volume resistivity during 100% extension [Ωcm] | | $8.8 \times 10^{-4}$ | $5.2 \times 10^{-3}$ | $2.4 \times 10^{-3}$ | $9.9 \times 10^{-3}$ | $2.9 \times 10^{-3}$ | $4.1 \times 10^{-3}$ | $7.9 \times 10^{-3}$ |
| | Applicability to flexible wiring board | | ○ | ○ | ○ | ○ | ○ | ○ | ○ |
| | Responsiveness of actuator | | ○ | ○ | ○ | ○ | ○ | ○ | ○ |

<Fulfillment of Conditions (A) and (B)>

Figure 9:
FIG. 9 is an SEM photograph of a cross-section in a film thickness direction of a conductive film of an embodiment 1.
Figure 10:
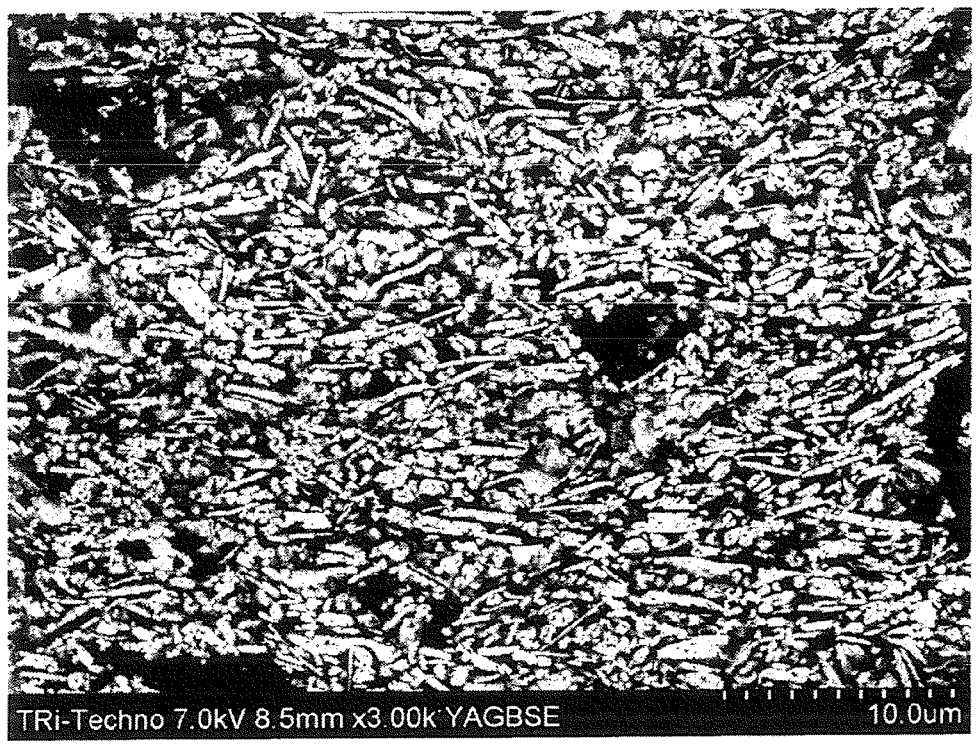
FIG. 10 is an SEM photograph of a cross-section in a film thickness direction of a conductive film of a comparative example 1.
Figure 13:
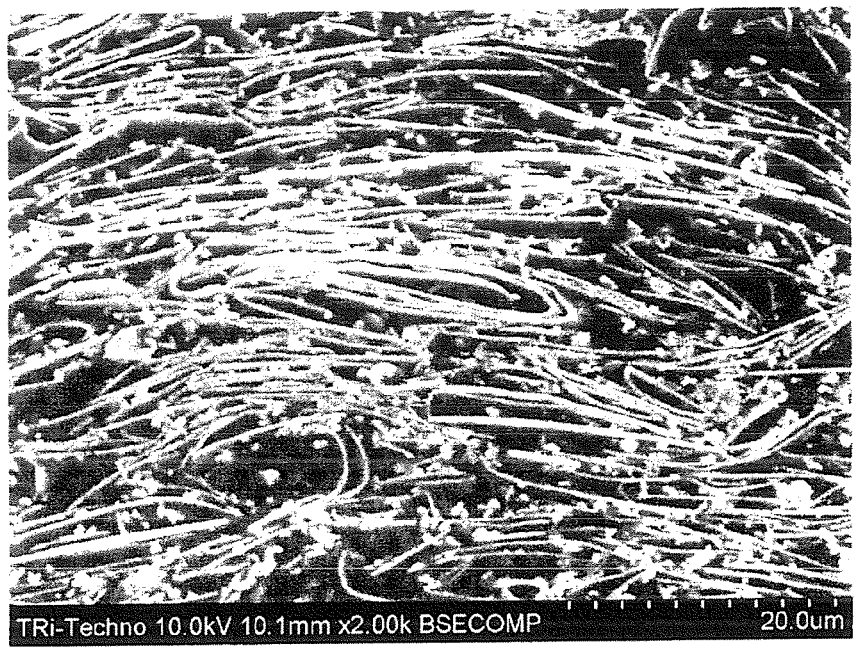
FIG. 13 is an SEM photograph of a cross-section in a film thickness direction of a conductive film of an embodiment 8.

With respect to the conductive films of the embodiments and the comparative examples, SEM photographs of cross-sections in the film thickness direction were taken, and whether the conditions (A) and (B) were satisfied was investigated. First, each of the conductive films was embedded in an epoxy resin, and a cross-section in the film thickness direction was cut out by using a microtome. Next, an SEM photograph of the cross-section was taken (magnification is 1000-5000 times). As an example of the SEM photograph, FIG. 9 illustrates the SEM photograph of the cross-section in the film thickness direction of the conductive film of the embodiment 1. FIG. 10 illustrates the SEM photograph of the cross-section in the film thickness direction of the conductive film of the comparative example 1. FIG. 13 illustrates the SEM photograph of the cross-section in the film thickness direction of the conductive film of the embodiment 8. As FIG. 9 illustrates, with respect to the conductive film of the embodiment 1, it was confirmed that flake-like filler particles (the silver powders A and B) in the elastomer are oriented in the film expansion direction (the left-right direction). As FIG. 13 illustrates, with respect to the conductive film of the embodiment 8, it was possible to confirmed that the flake-like filler particles (the silver powder D) have a large length in the film expansion direction and a large aspect ratio as compared to the conductive film of the embodiment 1 (FIG. 9).

[Condition (A)]

First, three straight lines each having a length of 10 μm extending in the film thickness direction were drawn in approximately a central part of the SEM photograph with spacings at 3 μm each. Next, with respect to each of the straight lines, a count was made of the number of the metallic filler particles that intersect the straight line and that each have a longest portion with a length of 2 μm or more. Next, by dividing the obtained number by the length of the straight line, a reference number for each of the straight lines was calculated. Then, an average value of the three reference numbers was calculated. The average values of the reference numbers for the conductive films of the embodiments and the comparative examples are summarized in the above Table 1 and Table 2.

[Condition (B)]

First, a square measurement area with 20 μm per side was provided on the SEM photograph. Next, the measurement area was partitioned into 100 (10×10) square unit areas each with 2 μm per side. Next, using binary image analysis software, the unit areas were each converted to a black-and-white bitmap. Then, for each of the unit areas, an area percentage occupied by the elastomer was calculated from the numbers of pixels of the elastomer and the metallic filler particles. The number of unit areas for which the area percentage occupied by the elastomer is 60% or more for the conductive films of the embodiments and the comparative examples are summarized in the above Table 1 and Table 2.

<Evaluation Method>

With respect to the conductive films of the embodiments and the comparative examples, flexibility and conductivity were evaluated. In the following, evaluation methods for the flexibility and the conductivity are respectively explained.

[Flexibility]

With respect to the conductive films, tensile tests were performed according to JIS K7127 (1999). Test specimens had a shape of a type 2 test specimen. Elastic modulus of a conductive film was calculated from an obtained stress-extension curve.

[Conductivity]

Volume resistivities of the conductive films were measured according to a parallel terminal electrode method of JIS K6271 (2008). In this case, as an insulating resin support tool supporting a conductive film (test specimen), a commercially available butyl rubber sheet (manufactured by Tigers Polymer Corporation) was used. Two types of volume resistivity measurements were performed depending on whether the conductive film was extended. That is, one type was performing a measurement in a natural state (without extension), and the other type was performing a measurement in an extended state in which an extension ratio is 100%. Here, the extension ratio is a value calculated from the following Equation (I).

$$\text{Extension ratio (\%)} = (\Delta L_0 / L_0) \times 100 \tag{I}$$

[where $L_0$ is a distance between mark lines of a test specimen, and $\Delta L_0$ is an increment of the increase in the distance between the marked lines of the test specimen due to extension]

<Evaluation Results>

Evaluation results for the conductive films of the embodiments and the comparative examples are summarized in the above Table 1 and Table 2. As Table 1 and Table 2 illustrate, the conductive films of the embodiments 1-7 all satisfy both the condition (A) [the average value of the reference numbers is 0.8 (1/μm) or more] and the condition (B) [the number of unit areas for which the area percentage of the elastomer is 60% or more is 20 or more]. The conductive films of the embodiments 8-11 contain the flake-like filler particles (the silver powder D) having a thickness of 0.2 μm and an aspect ratio of 65. Therefore, the conductive films of the embodiments 8-11 satisfy both the condition (A) [the metallic filler particles include flake-like metallic filler particles having a thickness 1 μm or less and an aspect ratio of 26 or more, and the average value of the reference numbers is 0.4 (1/μm) or more] and the condition (B) [the number of unit areas for which the area percentage of the elastomer is 60% or more is 20 or more]. Therefore, the conductive film of the embodiments 1-11 all are flexible and have high conductivity, and their electrical resistances hardly increase even when they are extended.

For example, the conductive films of the embodiments 1, 2 and 4 had high conductivity in the natural state. When making a comparison between the embodiments 1, 2 and 4, in the same order, the number in the condition (B) decreases. Accordingly, in the order of the embodiments 1, 2 and 4, the elastic modulus increased. In other words, the flexibility decreased. Therefore, with respect to the embodiments 2 and 4, as compared to the embodiment 1, although the volume resistivity was small in the natural state, the volume resistivity became large after extension of the conductive films.

The conductive film of the embodiment 3 contains only flake-like filler particles having a very thin thickness (the silver powder A: about 0.2 μm). With respect to the conductive film of the embodiment 3, despite a small filling amount (volume percentage) of the metallic filler particles, conductivity is ensured. Thus, when anisotropic filler particles having thin thickness are used, even with a small filling amount, conductive paths can be efficiently formed in the elastomer.

The conductive film of the embodiment 1, for which an acrylic rubber was used, had a low elastic modulus as compared to the elastic moduli of the conductive films of the embodiments 5-7, for which a urethane rubber and the like were used. Differences in the elastic moduli are also clear when making a comparison between the embodiment 8 and the embodiments 9-11. The conductive films of the embodiments 8-11 contain flake-like filler particles (the silver powder D) having large aspect ratios. Because of the large aspect ratios, the filler particles are likely to be in contact with each other. Thereby, conductive paths can be efficiently formed in the elastomer. Therefore, with respect to the conductive films of the embodiments 8-11, even when the filling amount of the metallic filler was small, the conductivity was high.

On the other hand, among the conductive films of the comparative examples, none satisfied both the conditions (A) and (B). For example, the comparative example 1 does not satisfy either of the conditions (A) and (B). The elastic modulus of the comparative example 1 is very high. Therefore, although the volume resistivity was small in the natural state, cracks occurred when the conductive film was extended, and so the volume resistivity significantly increased. Of the two conditions, the comparative example 2 satisfies the condition (B), but does satisfy the condition (A). That is, with respect to the comparative example 2, the flexibility is high, but the conductivity is insufficient. This point is clear also from the value of the volume resistivity. As compared to the embodiment 3, the comparative example 2 used flake-like filler particles having a thick thickness (the silver powder B: about 0.9 μm). Therefore, it is believed that, at a filling amount of 31% by volume of the metallic filler particles, sufficient conductive paths were not formed, and so the volume resistivity was large. Of the two conditions, the comparative example 3 satisfies the condition (A), but does not satisfy the condition (B). That is, with respect to the comparative example 3, the conductivity is high, but the flexibility is poor. Therefore, although the volume resistivity was small in the natural state, cracks occurred when the conductive film was extended, and so the volume resistivity significantly increased. The comparative example 4 does not satisfy either of the conditions (A) and (B). With respect to the comparative example 4, although the volume resistivity was small in the natural state, the volume resistivity increased when the conductive film was extended.

With respect to the conductive films of the embodiments and the comparative examples, applicability to a flexible wiring board was evaluated. That is, when volume resistivity of a conductive film in the extended state in which the extension ratio is 100% was $1 \times 10^{-2}$ Ωcm or less, the conductive film was evaluated as "applicable" (indicated by a sign O in Table 1 and Table 2), and when the volume resistivity of the conductive film in the extended state in which the extension ratio is 100% was above $1 \times 10^{-2}$ Ωcm, the conductive film was evaluated as "not applicable" (indicated by a sign X in Table 1 and Table 2). As a result, as illustrated in Table 1 and Table 2, it was confirmed that all of the conductive films of the embodiments are suitable for a flexible wiring board.

<Application to Actuator>

Actuators using the conductive films of the embodiments and the comparative examples for electrodes were prepared, and responsiveness of the actuators was evaluated.

Figure 11:
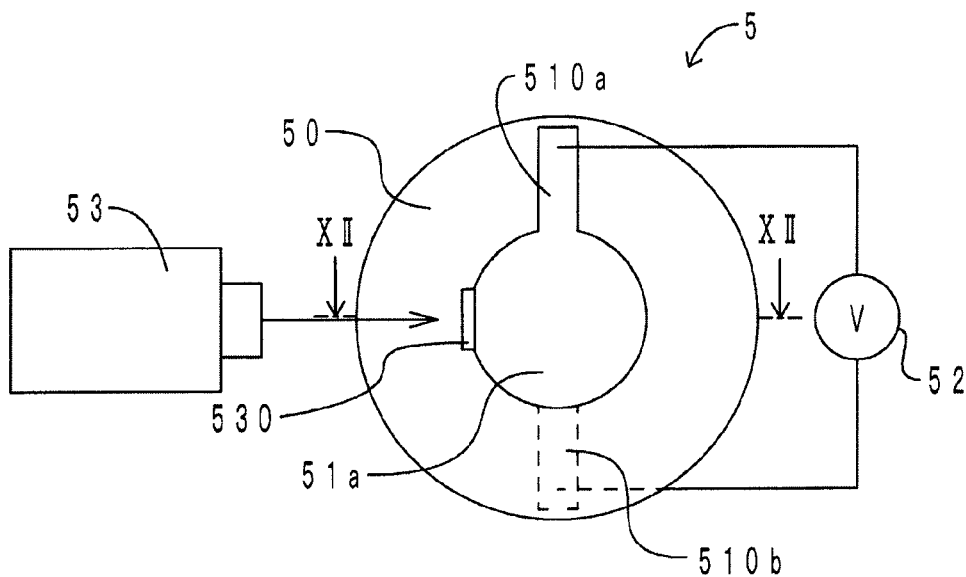
FIG. 11 is a top view of an actuator used in an evaluation experiment.
Figure 12:
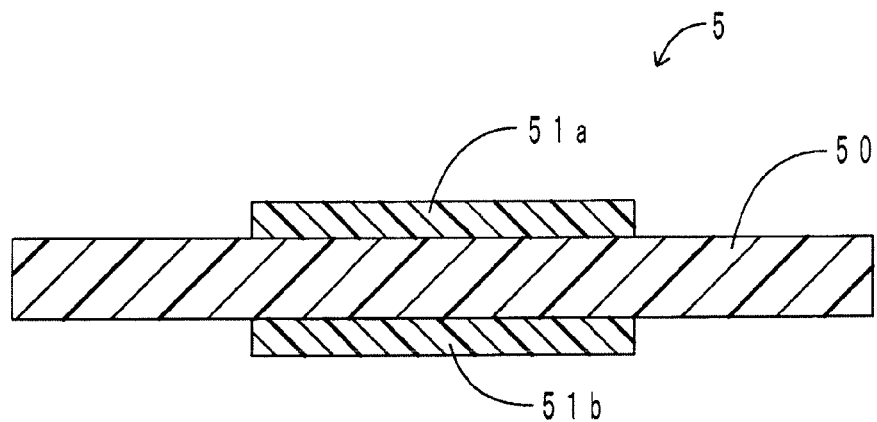
FIG. 12 is a cross-sectional view along a line XII-XII in FIG. 11.

First, an experimental equipment is explained. An actuator was prepared by pasting a conductive film of the embodiments and the comparative examples on both sides in a thickness direction of a dielectric film made of an acrylic rubber. FIG. 11 illustrates a top view of the prepared actuator. FIG. 12 illustrates a cross-sectional view along a line XII-XII in FIG. 11.

As FIG. 11 and FIG. 12 illustrate, an actuator 5 includes a dielectric film 50 and a pair of electrodes 51a and 51b. The dielectric film 50 has a circular thin film shape having a diameter of 70 mm and a thickness of 50 μm. The dielectric film 50 is arranged in a state in which the dielectric film 50 is biaxially extended at an extension ratio of 50%. Here, the extension ratio is a value calculated from the following Equation (II).

$$\text{Extension ratio (\%)} = \{\sqrt{(S_2/S_1)} - 1\} \times 100 \quad \text{(II)}$$

[where $S_1$ is an area of the dielectric film before being extended (natural state), and $S_2$ is an area of the dielectric film after being biaxially extended] The pair of electrodes 51a and 51b are arranged so as to face each other in an up-down direction across the dielectric film 50. The electrodes 51a and 51b each have a circular thin film shape having a diameter of about 27 mm and a thickness of 20 μm, and are respectively arranged in an approximately concentric manner with respect to the dielectric film 50. The electrodes 51a and 51b are formed from a conductive film of the embodiments or the comparative examples. On an outer periphery of the electrode 51a, a terminal 510a protruding in a diameter-expansion direction is formed. The terminal 510a has the shape of a rectangular plate. Similarly, on an outer periphery of the electrode 51b, a terminal 510b protruding in a diameter-expansion direction is formed. The terminal 510b has the shape of a rectangular plate. The terminal 510b is arranged at a location 180° opposite with respect to the terminal 510a. The terminals 510a and 510b are respectively connected to a power source 52 via electrical leads.

When a voltage is applied between the electrodes 51a and 51b, an electrostatic attraction occurs between the electrodes 51a and 51b, which compresses the dielectric film 50. Thus, the dielectric film 50 becomes thinner and extends in the diameter-expansion direction. In this case, the electrodes 51a and 51b, together with the dielectric film 50, extend in the diameter-expansion direction. A marker 530 is attached to the electrode 51a in advance. Displacement of the marker 530 was measured using a displacement meter 53, and was used as a displacement amount of the actuator 5.

In the following, an evaluation method of the responsiveness of the actuator is explained. First, a voltage having an electric field strength of 40 V/μm was applied, and the displacement amount was measured. The electric field strength is a value obtained by dividing the applied voltage by the thickness of the dielectric film. Next, from the measured displacement amount, a displacement ratio was calculated from the following Equation (III).

$$\text{Displacement ratio (\%)} = (\text{displacement amount/electrode radius}) \times 100 \quad \text{(III)}$$

When the displacement ratio is 4% or more, the responsiveness was evaluated as "good" (indicated by a sign O in Table 1 and Table 2), and when the displacement ratio is less than 4%, the responsiveness was evaluated as "poor" (indicated by a sign X in Table 1 and Table 2).

The evaluation results are summarized in the above Table 1 and Table 2. As illustrated in Table 1 and Table 2, it was confirmed that all actuators using the conductive films of the embodiments had good responsiveness.

INDUSTRIAL APPLICABILITY

The flexible actuator can be used in, for example, artificial muscles for industrial, medical and welfare robots; small pumps for cooling electronic components, for medical applications, and the like; medical equipments; and the like. The conductive film of the present invention is suitable for electrodes, wirings, and the like of such a flexible actuator. Further, the conductive film of the present invention is also suitable for electrodes, wirings, and the like of an elastomeric sensor such as a capacitance-type sensor and the like. Further, the conductive film of the present invention is also suitable for electrodes, wirings, and the like of an electric generating element, as well as flexible transducers performing light generation, heat generation, color generation, and the like. Further, the conductive film of the present invention is also useful for a flexible wiring board and the like used in a wearable device and the like.

The conductive film of the present invention is superior in flexibility and conductivity, and therefore can be used in a member for which electrical control and flexible contact are required. For example, the conductive film of the present invention is suitable for an electrode layer and a surface layer in a development roll, a charging roll, a transfer roll, a paper feeding roll, a toner layer forming member, a cleaning blade, a charging blade, and the like, which are used in OA (Office Automation) equipment such as a laser beam printer and the like.

What is claimed is:

1. A conductive film containing an elastomer and metallic filler particles filled in the elastomer, the metallic filler particles including anisotropic filler particles oriented in the film expansion direction having a flake-like or needle-like shape with a thickness of 1 μm or less, the conductive film satisfying the following conditions (A) and (B):

(A) In a case where three straight lines extending in a film thickness direction are drawn on a film-thickness-direction cross-section photograph taken by using a scanning electron microscope with spacings at 3 μm each between the three straight lines in a film expansion direction; where, with respect to each of the straight lines, a count is made of the number of metallic filler particles that intersect the straight line and that each have a longest portion in the cross-section photograph with a length of 2 μm or more; and where, by dividing that number by the length of the straight line, a reference number per 1 μm of the straight line is calculated, an average value of the reference numbers of the three straight lines is 0.8 (1/μm) or more; or, the metallic filler particles include flake-like filler particles having a thickness of 1 μm or less and an aspect ratio of 26 or more, and the average value of the reference numbers is 0.4 (1/μm) or more; and (B) In a case where a measurement area formed by connecting 100 four-sided unit areas each with 2 μm per side is provided on the film-thickness-direction cross-section photograph taken by using the scanning electron microscope, and an area occupied by the elastomer in each of the unit areas is measured, a number of unit areas for which an area percentage of the elastomer is 60% or more is 20 unit areas or more.

2. The conductive film according to claim 1, wherein a filling amount of the metallic filling particles is less than 45% by volume when a volume of the conductive film is 100% by volume.

3. The conductive film according to claim 1, wherein the metallic filler particles further include block-shaped filler particles having an average particle size of 0.1 μm or more and 1.5 μm or less.

4. The conductive film according to claim 3, wherein a content ratio between the anisotropic filler particles and the block-shaped filler particles is from 2:1 to 50:1 in mass ratio.

5. The conductive film according to claim 1, wherein the elastomer has a functional group capable of hydrogen bonding, and has a glass transition temperature (Tg) of −10° C. or lower.

6. The conductive film according to claim 5, wherein the elastomer is of at least one kind selected from an acrylic rubber, a urethane rubber, a hydrin rubber, and a silicone rubber.

7. The conductive film according to claim 6, wherein the acrylic rubber contains 50% by mole or more of an acrylic acid ester monomer unit having an alkyl group of four or more carbon atoms.

8. The conductive film according to claim 1, wherein a compound containing sulfur is not used for cross-liking of the elastomer.

9. The conductive film according to claim 1 being formed on a surface of an elastic member made of an elastomer.

10. A transducer comprising:
a dielectric film made of an elastomer;
a plurality of electrodes arranged across the dielectric film; and
wirings connected to each of the plurality of electrodes, wherein
of the electrodes and the wirings, at least one is formed from the conductive film according to claim 1.

11. A flexible wiring board wherein at least a portion of a wiring is formed from the conductive film according to claim 1.

* * * * *